United States Patent Office 3,827,908

Patented Aug. 6, 1974

3,827,908

METHOD FOR IMPROVING PHOTORESIST ADHERENCE

Claude Johnson, Jr., Yorktown Heights, and Myron D. Palmer, Pleasant Valley, N.Y., assignor to International Business Machines Corporation, Armonk, N.Y.

No Drawing. Filed Dec. 11, 1972, Ser. No. 314,050

Int. Cl. B44c *1/18;* B44d *1/52*

U.S. Cl. 117—201 7 Claims

ABSTRACT OF THE DISCLOSURE

A process for improving the adhesion of a photoresist material to the oxide surface of a semiconductor substrate is disclosed. The method comprises adding 1-hydroxyethyl, 2-alkylimidazolines to phenol formaldehyde resins having diazo-ketone sensitizers.

BACKGROUND OF THE INVENTION

Field of the Invention

This invention pertains to a method for increasing the adhesion of photoresist materials to the oxide surface of semiconductor substrates. More particularly, it relates to a process for treating an oxide surface with a photoresist material which has improved adhesion properties, therefore enabling smaller patterns to be reproducibly etched in the oxide. Most especially, the invention relates to a process for producing silicon dioxide masks used for the selective diffusion of impurities into semiconductors.

Description of the Prior Art

As integrated circuits continue to be more and more miniaturized and more densely populated on the chip, there is an increased need for better dimensional control in the photolithographic process. In the fabrication of a variety of articles, it is often necessary to protect selected areas of an oxide surface while other areas of the same surface are being exposed to further process procedures. For example, in the fabrication of semiconductor devices, wherein an oxide coating is formed on a semiconductor substrate, it is often necessary to remove selected portions of the oxide coating so as to permit diffusion of a suitable impurity through the oxide layer into the underlying semiconductor devices, such as single crystal field effect transistors. This type of device is formed by vapor diffusing a suitable impurity into a wafer of a single silicon crystal to form suitable P-type and N-type junctions therein. In order to provide distinct P and N junctions, which are necessary for the proper operation of the device, diffusion should occur through only a limited portion of the substrate. Normally, this is accomplished by masking the substrate with a diffusion-resistant material, such as silicon dioxide, which is formed into a protective mask to prevent diffusion through the selected regions of the substrate. The silicon dioxide mask is typically provided by forming a uniform oxide layer over the wafer substrate and thereafter creating a series of openings through the oxide layer which allows the passage of the impurity directly into the underlying surface within a limited area. These openings are readily created by coating the oxide with a material known as a photoresist. This may be either a material capable of polymerizing and insolubilizing on exposure to light (a negative resist), or a material capable of depolymerizing and solubilizing on exposure to light (a positive resist). The photoresist coating is selectively exposed to light, causing polymerization or depolymerization to occur above those regions of the oxide which are intended to be protected or etched for the subsequent diffusion. The soluble portions of the photoresist are removed by a solvent which is inert to the polymerized portion of the resist. A suitable etchant for silicon dioxide, such as hydrogen fluoride, is applied to remove the unprotected oxide regions.

It has been observed, however, that upon exposure of the masked silicon dioxide surface to the etchant, the photoresist coating tends to curl away from the oxide surface. This permits severe undercutting of the layer immediately beneath the edges of the protective photoresist. The result is to expose additional areas of the silicon substrate to the impurity diffusion and create deleteriously indistinct P and N-type junctions. The resulting semiconductor device is therefore characterized by a significantly decreased output relative to that which should theoretically be provided. In field effect transistors at least two openings must be created through the oxide surface, corresponding to the source and drain of the device. Thus, there are at least four edges whose lack of resolution will influence the width of the source and drain and, more importantly, the width of the gate lying between the source and drain. Furthermore, the impurity tends to spread after entering the wafer body. Since two separate diffusion regions are being generated simultaneously, the probability of shorting within the device, especially if narrow gate widths are desired, becomes increasingly more probable as the lack of resolution increases.

Recognizing this problem, the art first proposed heating the photoresist prior to etching, such as by postbacking, with the hope of providing a more adherent bond between the oxide surface and the resist to prevent the curling or listing effect which seems to cause the lack of resolution. Post-baking has not proved to be an altogether satisfactory technique because its effectiveness is largely dependent on the particular oxide substrate being treated and on the surface conditions of the oxide layer, whether it contains impurities, such as phosphorous pentoxide, or water. Moreover, the normal variations in the oxide thickness result in certain layers being exposed to the etching solution longer than others, thereby accentuating the degree of resist curling or lifting, and requiring a greater degree of post-baking in some regions than in others for the same substrate. Not only is post-baking a more unrelaible means for bonding a photoresist to an oxide surface, but after treating the selected portions of the surface, the post-baked resist is often more difficult to remove. Post-baking cannot, therefore, be used as a routine procedure.

It has been found that a more advantageous method for preventing resolution losses is in providing a photoresist material which has improved adhesion characteristics and properties which allow an improved bond of the photoresist material to the oxide coated substrate material. While several improved coating compositions have been heretofore proposed, none have proved to be entirely satisfactory. Those having suitable bonding abilities are generally toxic, having corrosive by-products, and often require some degree of post-baking. Other methods embody coating the semiconductor oxide coated substrate with an adhesion promoter prior to the application of the photoresist material.

Although the problems of treating oxide surfaces with coatings of photoresist has been described principally in relation to the formation of semiconductor devices, the same problems have been found to occur in the formation of other types of articles in which an oxide surface is selectively etched.

Prior art silicon containing adhesive promoters often requires some period of time to allow for contact with the oxide surface prior to the application of the photoresist. An adhesion promoter which enables one to eliminate such a period of waiting would be advantageous and especially where the adhesion promoter can be mixed with the photoresist material in bulk.

The prior art methods are more fully described in U.S. Pat. No. 3,586,554 which deals with treating the semiconductor wafer with a disilylamide and U.S. Pat. No. 3,549,368 which relates to a method of applying a photoresist to a substrate whereby the adhesion is facilitated by the use of hexa-alkyldisilazane.

SUMMARY OF THE INVENTION

It is an object of this invention to increase the adhesive properties of photoresist material to semiconductor oxide substrate surfaces.

It is a further object of this invention to decrease the size of patterns that may be reproducibly etched in an oxide surface by increasing the adhesion of the photoresist to the semiconductor oxide surface.

It is another object of this invention to provide a photoresist coating for the etching of an oxide which oxide will not curl or lift from the edge of the etched regions.

It is still a further object of this invention to eliminate the baking of the photoresist layer prior to etching.

The foregoing and other objects of this invention may be obtained by the addition of from 0.15 to 2 grams per 100 cc. of photoresist of 1-hydroxyethyl, 2-alkylimidazolines having the following structural formula:

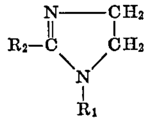

where $R_1$ represents the hydroxyethyl group and $R_2$ a fatty acid or a mixture of fatty acids having from 7 to 21 carbon atoms to photoresist materials containing phenol formaldehyde resins having a diazo-ketone sensitizer which are more particularly described in U.S. Pat. No. 3,201,239.

The use of the aforesaid additives to photoresist materials has an adhesion promoter. It is also beneficial to reduce pin holes and to act to some extent as a plasticizer which overcomes the brittleness often encountered with the use of positive photoresist materials.

The 1-hydroxyethyl, 2-alkylimidazoline additive may be applied full strength or can be applied in admixture with a diluent or solvent such as xylene. It can be applied by any one of the several common coating techniques, for example, upon the admixture of the adhesion promoter and the photoresist material. The resulting solution may be applied to a semiconductor substrate by spray-spinning whereby a quantity of the resist mixture is coated on the wafer and the wafer is subjected to a centrifugal force at speeds of from 3,000 to 6,000 r.p.m. Alternatively, the material may be applied by dipping or immersing the wafer into a solution of the adhesion promoter and the photoresist. The use of these adhesion promoters results in substantially less undercutting of oxide material covered with photoresist in selective etching operations compared with the undercutting obtained with the known adhesion promoters such as chlorosilanes. It is believed that under certain conditions, no undercutting of the photoresist covered oxide will take place. The improvement obtained through the use of said mixtures as photoresist adhesive promoting agents, enables more precise etching to be carried out. Consequently, semiconductor devices with higher outputs or with higher density of active components may be provided. The foregoing and other objects, features and advantages of the invention will be apparent from the following more particular description of the preferred embodiments of the invention.

DESCRIPTION OF THE PREFERRED EMBODIMENT

To about 115 cc. of AZ 1350 (Shipley Company, Inc., Newton, Mass.) photosensitive phenol formaldehyde resin photoresist material having a diazo ketone sensitizer identified as 4'-2'-3'-dihydroxybenzophenone ester of 1-oxo-2-diazonaphthalene-5-sulfonic acid was added approximately 0.15 grams of 1-hydroxyethyl, 2-alkylimidazoline having the structural formula:

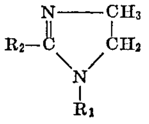

where $R_2$ is various fatty acids and mixtures thereof having from 9 to 17 carbon atoms and dissolved in xylene. The aforesaid heterocyclic nitrogen compounds are commercially identified as Monazolines and are more particularly described in Mona Industries Inc. Technical Bulletin 280 b, dated November 1966.

A monocrystalline silicon semiconductor wafer having a thermally grown layer of $SiO_2$ was coated with the above described modified photoresist material in a static condition followed by spin drying at 3600 r.p.m. for 30 seconds. A hotplate pre-bake at 90° C. was applied for 30 seconds. The photoresist then was developed in accordance with conventional techniques using AZ-azoplate developer and a water wash followed by a 140° C., 30 minute oven post-bake.

Wafers so treated were conventionally etched in a buffered etch solution of ammonium fluoride and hydrogen fluoride.

The results of the adhesion-promoted photoresist are measured by the normalized undercut per side of a line normalized for film thickness, i.e. microns of undercutting divided by film thickness in microns after the etching procedure. The less undercutting, i.e. lower numbers indicating less undercutting.

The following Table I illustrates comparative results using the additive of this invention and designated as Mona C compared with no promoter addition and the use of bis (trimethylsilyl) acetamide (BSA) and hexa-alkyldisilazane (HMDS), using three distinct passes or runs.

TABLE I

| Additive | Undercut per side, microns | | |
|---|---|---|---|
| | I | II | III |
| None | 2.8 | 2.3 | 2.0 |
| HMDS | 1.9 | 2.5 | 1.6 |
| BSA | 2.0 | 1.2 | 1.0 |
| Mona C | 1.0 | 0.8 | 1.1 |

Experimental work embraced the use of surface active agent additions such as monyl phenoxy poly (ethylene oxy) ethanol (Igepal), dioctyl sodium sulfosuccinate (Aerosol O–T), sodium glyceryl monolaurate (Syntex), and monyl phenyl polyethylene glycol ether (Tergitol) without any improved adhesion characteristics. Similarly, the use of quaternary detergents individually or in admixture did not improve adhesion properties with comparable results from boric acid, sodium lauryl sulfate and sodium saccharin.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for improving the adhesion of positive photoresist to oxide semiconductor surfaces which comprises admixing from 0.15–2 gms. 1-hydroxyethyl, 2-alkylimidazolines per 100 cc. of positive photoresist material and coating the said oxide semiconductor surface with said admixture.

2. The method of Claim 1 wherein the oxide surface is silicon oxide.

3. The method of Claim 1 wherein the 1-hydroxyethyl, 2-alkylimidazoline is

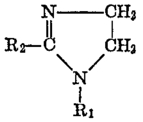

where $R_1$ is a hydroxyethyl group and $R_2$ a fatty acid having from 7 to 21 carbon atoms.

4. A method in accordance with Claim 3 wherein $R_2$ has 9 to 17 carbon atoms.

5. A method in accordance with Claim 1 wherein said positive photoresist is a phenol formaldehyde resin having a diazo-ektone sensitizer.

6. A method in accordance with Claim 5 wherein said sensitizer is 4′-2′-3′-dihydroxybenzophenone ester of 1-oxo-2-diazonaphthalene-5 sulfonic acid.

7. A method for improving the adhesion of positive photoresist to a silicon oxide surface, said method comprising: admixing, approximately in the proportion set forth hereinafter, 0.15 grams of 1-hydroxyethyl, 2-alkylimidazoline, and 115 cc. of photosensitive phenol formaldehyde resin photoresist material having a diazo ketone sensitizer, and coating said silicon oxide surface with said admixture, where said 1-hydroxyethyl, 2-alkylimidiazoline has the structural formula:

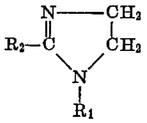

where $R_1$ is a hydroxyethyl group and $R_2$ is a fatty acid having from 7 to 21 carbon atoms, and where said diazo ketone sensitizer is 4′-2′-3′-dihydroxybenzophenone ester of 1-oxo-2-diazonaphthalene-5-sulfonic acid.

References Cited

UNITED STATES PATENTS

| | | | |
|---|---|---|---|
| 3,702,766 | 11/1972 | Bunham | 96—115 R |
| 3,615,567 | 10/1971 | Wilson | 96—115 R |
| 3,586,554 | 6/1971 | Couture | 117—215 |
| 3,549,368 | 12/1970 | Collins | 96—115 R |
| 3,408,361 | 10/1968 | Mannheimer | 260—309.6 |
| 3,386,828 | 6/1968 | Slimowicz | 96—91 R |
| 3,205,092 | 9/1965 | Rosenberg | 260—309.6 |
| 3,765,896 | 10/1973 | Fox | 96—91 R |
| 3,201,239 | 8/1965 | Neugebauer | 96—49 |

LEON D. ROSDOL, Primary Examiner

M. F. ESPOSITO, Assistant Examiner

U.S. Cl. X.R.

96—91R, 115 R; 117—5.5; 156—13; 260—309.6